United States Patent [19]
Lacey et al.

[11] Patent Number: 5,801,934
[45] Date of Patent: Sep. 1, 1998

[54] CHARGE PUMP WITH REDUCED POWER CONSUMPTION

[75] Inventors: Timothy M. Lacey, San Jose; Aaron Yip, Miliptas, both of Calif.

[73] Assignee: Cypress Semiconductor Corp., San Jose, Calif.

[21] Appl. No.: 762,871

[22] Filed: Dec. 12, 1996

[51] Int. Cl.$^6$ .................................................. H02M 3/18
[52] U.S. Cl. ........................... 363/60; 307/110; 327/536
[58] Field of Search ..................... 363/59, 60; 307/109, 307/110; 327/536

[56] References Cited

U.S. PATENT DOCUMENTS

| | | | |
|---|---|---|---|
| 4,559,548 | 12/1985 | Iizuka et al. | 357/23.6 |
| 5,008,799 | 4/1991 | Montalvo | 363/60 |
| 5,059,815 | 10/1991 | Bill et al. | 307/246 |
| 5,280,420 | 1/1994 | Rapp | 363/60 |
| 5,625,544 | 4/1997 | Kowshik et al. | 363/59 |
| 5,650,671 | 7/1997 | Pascucci et al. | 307/110 |

*Primary Examiner*—Adolf Berhane
*Attorney, Agent, or Firm*—Blakely, Sokoloff Taylor & Zafman LLP

[57] ABSTRACT

The present invention concerns an improved charge pump. The charge pump efficiently charges a voltage signal while reducing its power consumption. The charge pump includes at least one diode configured to receive a voltage signal. Coupled to the diode(s) is at least one capacitive device that is capable of coupling charge onto the diode(s). For one embodiment, the capacitive device provides a constant capacitance to more efficiently charge the voltage signal. The charge pump also includes an oscillating circuit that is capable of providing each capacitive device with an oscillating signal that alternates between a first voltage level and a second voltage level at a predetermined frequency. The oscillating circuit includes an odd number of N inverters coupled in a ring wherein an output of the Nth inverter is coupled to the input of the first inverter. For an alternative embodiment, each of the N inverters may anticipate a voltage switch on its inputs and therefore capable of powering "off" before the voltage switch occurs. As such, unnecessary power consumption resulting from the short circuit current in each of the N inverters is substantially reduced or eliminated.

21 Claims, 5 Drawing Sheets

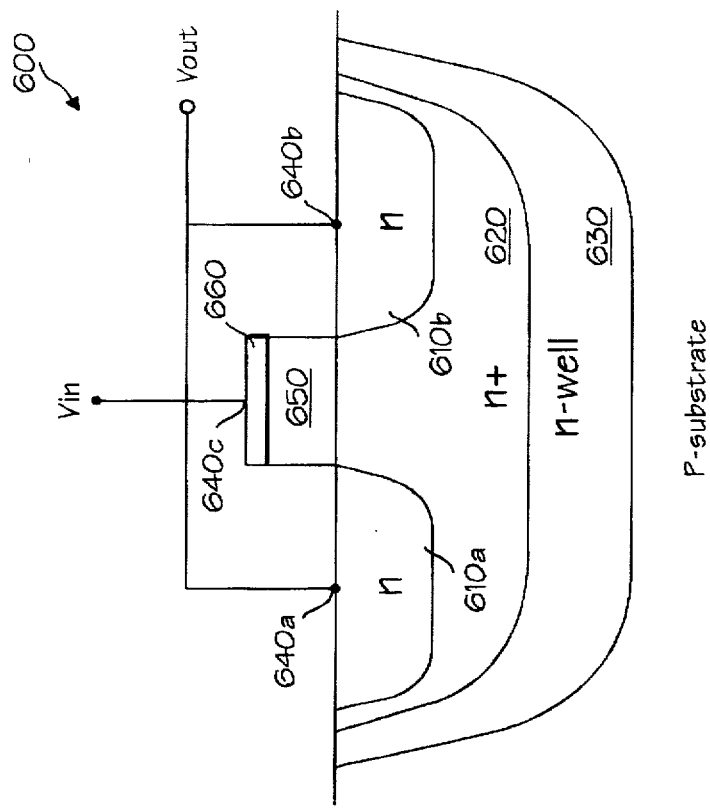
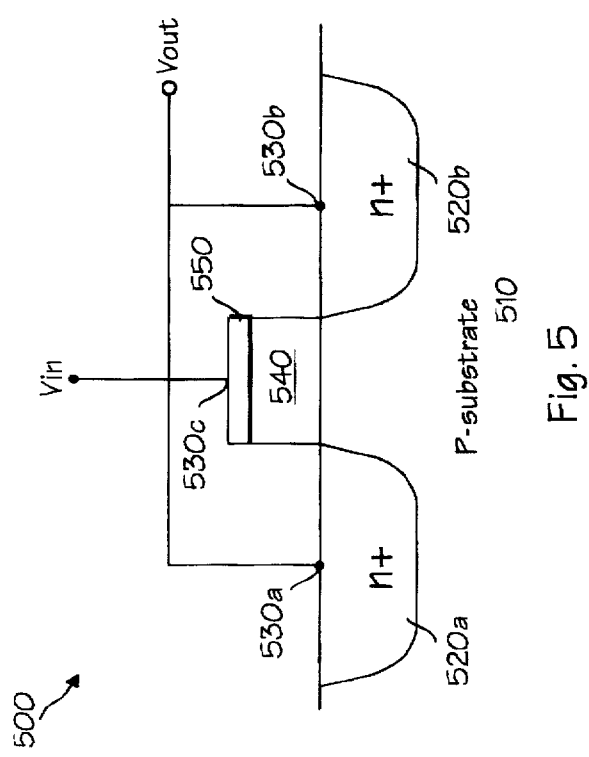
Fig. 6
Fig. 5

5,801,934

CHARGE PUMP WITH REDUCED POWER CONSUMPTION

BACKGROUND OF THE INVENTION

1. Field of the Invention

The present invention relates generally to the field of integrated circuits. More particularly, the present invention relates to the field of charge pumps.

2. Discussion of Related Art

Charge pumps are circuits that raise the voltage of a voltage signal. Typically, charge pumps raise the voltage signal to a higher voltage than the signal generated from the power supply of the integrated circuit ("IC"). For example, programmable logic devices may require a very high voltage (i.e. between 7–12 volts) to program the IC although the IC operates with a 5 volt power supply. Therefore, a charge pump is used to raise the 5 volt signal generated by the power supply to 7–12 volts during programming.

Although many different charge pump architectures exist today, the efficiency of the charge pump is typically related to how quickly the charge pump charges up the voltage signal. Current charge pumps use capacitive devices to charge the voltage signal. If the capacitive device is implemented with a metal oxide-semiconductor ("MOS") transistor, then the capacitive device does not start charging until the voltage across the gate terminal and the source/drain terminal approaches the threshold voltage of the MOS transistor.

As new technologies are developed to increase the speed of an integrated circuit, many integrated circuits are designed to operate with smaller power supplies such as a 3.3 volt power supply. By reducing the switching time between a logic "high" voltage level and a logic "low" voltage level or vice-versa, the IC is capable of operating at a faster speed. However, as the switching time is reduced, the lag period for turning "on" a capacitive device becomes a larger portion of the switching time. Therefore, it is desirable to turn "on" the capacitive device as soon as a voltage is applied to its input, especially in a high speed IC. This can be achieved by permanently turning "on" the MOS transistor. By eliminating this lag period, the charge pump raises the voltage level of a voltage signal more efficiently.

Because faster ICs generally consume more power than comparatively slow circuits, the circuit designer is challenged to minimize the overall power consumption of a high speed charge pump. Typically, the ring oscillator in a charge pump consumes a significant portion of the power consumed in a charge pump. Reducing the power consumption of the ring oscillator can be achieved by reducing the power consumption of each inverter in the ring oscillator. If the ring oscillator is implemented with CMOS inverters having a p-channel MOS transistor coupled to an n-channel MOS transistor, then the power consumption of the inverters can be reduced by eliminating its short circuit or crow-bar current. The short circuit or crow-bar current refers to the current that flows between Vcc and ground during the temporary period in which both the transistors are on (i.e. when the inverter switches voltage levels). Therefore, it is desirable to reduce the power consumption of the ring ator in a charge pump by eliminating short circuit or crow-bar current.

SUMMARY OF THE INVENTION

The present invention concerns an improved charge pump that efficiently charges a voltage signal. The charge pump includes at least one diode configured to receive a first voltage signal. Coupled to the diode(s) is at least one tap capacitor that is capable of coupling charge onto the diode (s). The charge pump also includes an oscillating circuit that is capable of providing each tap capacitor with an oscillating signal that alternates between a first voltage level and a second voltage level at a predetermined frequency.

The present invention also concerns an improved charge pump that operates with reduced power consumption. The charge pump includes at least one diode configured to receive a first voltage signal. Coupled to the diode(s) is at least one capacitive device that is capable of coupling charge onto the diode(s). The charge pump also includes an oscillating circuit that may reduce or eliminate unnecessary power consumption by one or more inverters in the oscillating circuit. The oscillating circuit includes an odd number of inverters coupled in a ring. Each of the inverters is capable of powering down before a voltage switch occurs on its input.

The present invention further concerns an inverter circuit that operates with reduced power consumption. The inverter circuit includes an odd number N of inverters serially coupled such that the first inverter is coupled to the input of the inverter circuit and the Nth inverter is coupled to the output of the inverter circuit. The inverter circuit is also includes a first and a second power switch. The output of the inverter circuit provides the first and the second power switches with an enable signal. In response to the enable signal, the first and second power switches respectively couple or decouple the first inverter to the first and second voltage conduit. The inverter circuit further includes a feedback inverter that is coupled in parallel with a second inverter to stabilize the node between the first and the second inverters when the first inverter is powered "off" by the first and the second power switches.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 5 illustrates a typical capacitor.

FIG. 6 illustrates one embodiment of a capacitive device in the present charge pump circuit.

DETAILED DESCRIPTION

The following detailed description sets forth embodiments in accordance with the present invention for an improved charge pump architecture. In the following description, details are set forth, such as specific circuitry configurations, in order to provide a thorough understanding of the present invention. It will be evident, however, that the present invention may be practiced other than in strict accordance with these details. In other instances, the functioning of well-known circuit components, logic gates, etc., have not been described in particular detail so as not to obscure the present invention.

The present invention provides an apparatus for charging up a voltage signal that is particularly well suited for high speed integrated circuits that require a small power supply voltage. For one embodiment, the present invention improves the efficiency of a charge pump by incorporating capacitors that immediately start charging up a node once a voltage is applied to the input of the capacitor. In other words, the improved capacitors may have a constant capacitance and may not have a lag period in which that voltage applied to the input of the capacitor is considered a "dead voltage". These capacitors are sometimes referred to as "tap" capacitors.

The present invention also provides an apparatus that reduces the power consumption of a charge pump. Typically, the ring oscillator in the charge pump consumes a significant portion of the power. More specifically, the power consumed by the inverters in the ring oscillator may be reduced. Therefore, by providing a ring oscillator that substantially reduces or eliminates the crow-bar or short circuit current in its inverters, the power consumption of the ring oscillator is reduced and the overall power consumption of the charge pump is reduced. Furthermore, the present apparatus may also reduce the frequency of the ring oscillator, thereby reducing or eliminating the use of parasitics or longer length devices to slow down the oscillator.

The present invention also provides an apparatus that reduces the power consumption in an inverter circuit by substantially eliminating the crow-bar current or short circuit current. The short circuit current in the inverter circuit is minimized by having the inverter circuit anticipate a switch in the voltage level of the input voltage.

Tap capacitors and the present low-power ring oscillators may be implemented in almost any charge pump architecture. Furthermore, virtually any circuit that uses a ring oscillator may have its power consumption reduced by incorporating the present low-power ring oscillator and the anticipating inverter circuit. Additionally, the anticipating inverter circuit may be used in almost any circuit that requires an inverter.

Figure 1:
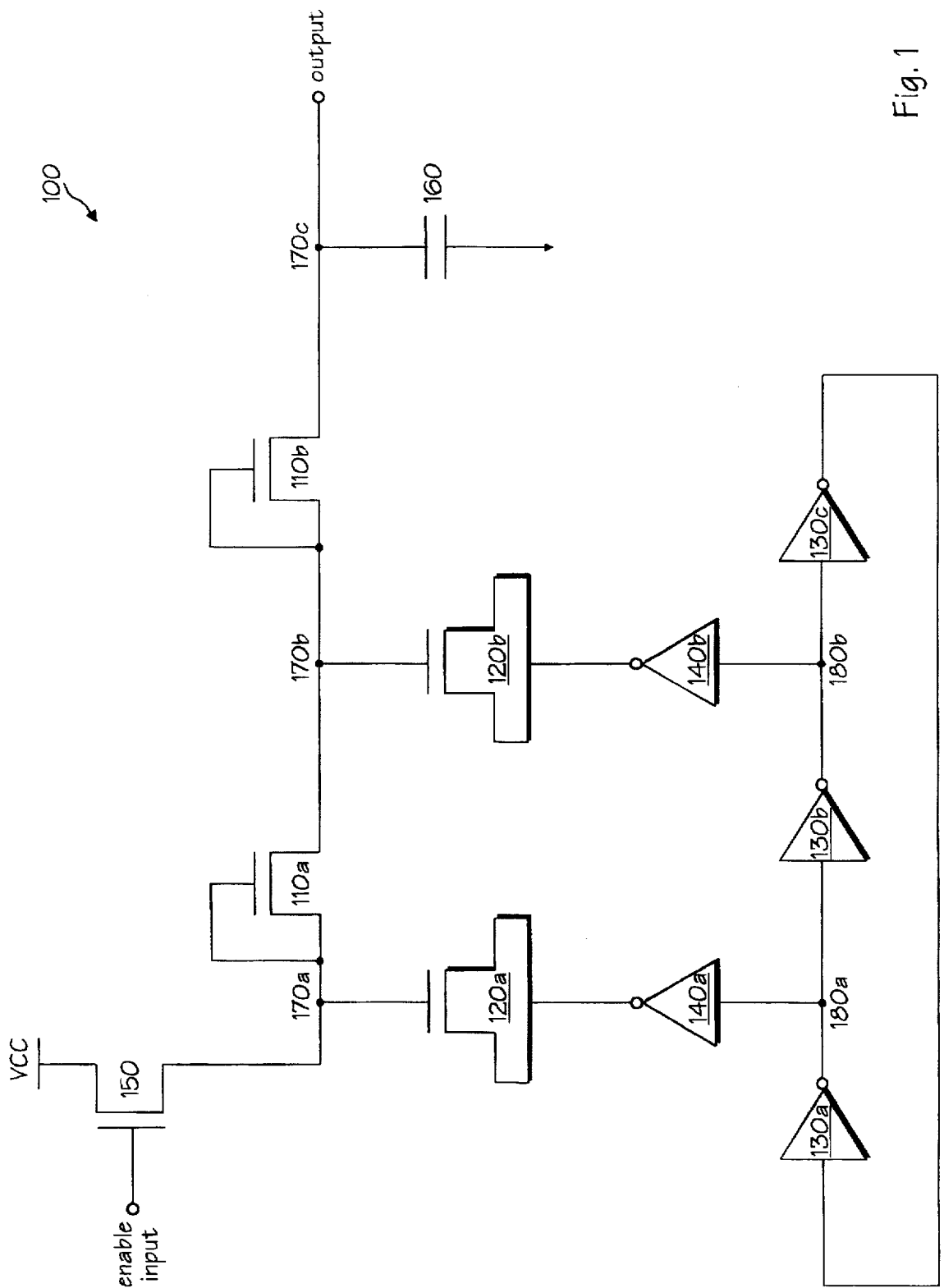
FIG. 1 illustrates a charge pump circuit.

FIG. 1 illustrates a typical charge pump. The charge pump 100 is referred to as a dual pump because it uses two diodes to charge up the voltage at the output. According to FIG. 1, the input of the diode 110a is coupled to the transistor 150 at node 170a, and the output of the diode 110a is coupled to the input of the diode 110b at node 170b. Furthermore, the output of diode 110b is coupled to output of the charge pump 100 at node 170c which is coupled to ground via the parasitic load capacitor 160.

For one embodiment, the transistor 150 is an n-channel MOSFET having its drain terminal coupled to Vcc, its source terminal coupled to node 170a and its gate coupled to an enable signal. The transistor 150 operates as a power supply switch in response to the enable signal. In other words, if the enable signal is at a logic "high" voltage level, then the transistor 150 is turned "on" and the current generated by Vcc flows through transistor 150 onto node 170a. On the other hand, if the enable signal is at a logic "low" voltage level, then the transistor 150 is turned "off" and node 170a is decoupled from Vcc.

The capacitors 120a and 120b are responsible for charging the voltage signals at nodes 170a and 170b, respectively. The capacitor 120a has an output coupled to the ring oscillator at node 180a via the inverter 140a and an input coupled to node 170a. The capacitor 120b has an output coupled to the ring oscillator at node 180b via the inverter 140b and an input coupled to node 170b. For one embodiment, the capacitors 120a and 120b are n-channel MOS transistors having their drain and source terminals coupled together.

As mentioned above, the capacitors in a charge pump are typically implemented with transistors that have a lag time before they are capable of charging up a node. In other words, the transistor 120a does not start charging the voltage at node 170a until the voltage between the gate and the drain/source of the transistor 120a approaches the threshold voltage of the transistor 120a. Therefore, the capacitors 120a and 120b do not effectively pass charge onto nodes 170a and 170b, respectively for a lag period.

The ring oscillator generates two oscillating output signals. Each output signal alternatives between a logic "high" voltage level and a logic "low" voltage level at a predetermined frequency (e.g. 100 megahertz). Furthermore, the first oscillating signal at node 180a has the opposite voltage level from the second oscillating signal at node 180b. According to FIG. 1, the ring oscillator includes the inverters 130a, 130b and 130c which are coupled together to form a ring.

Figure 2:
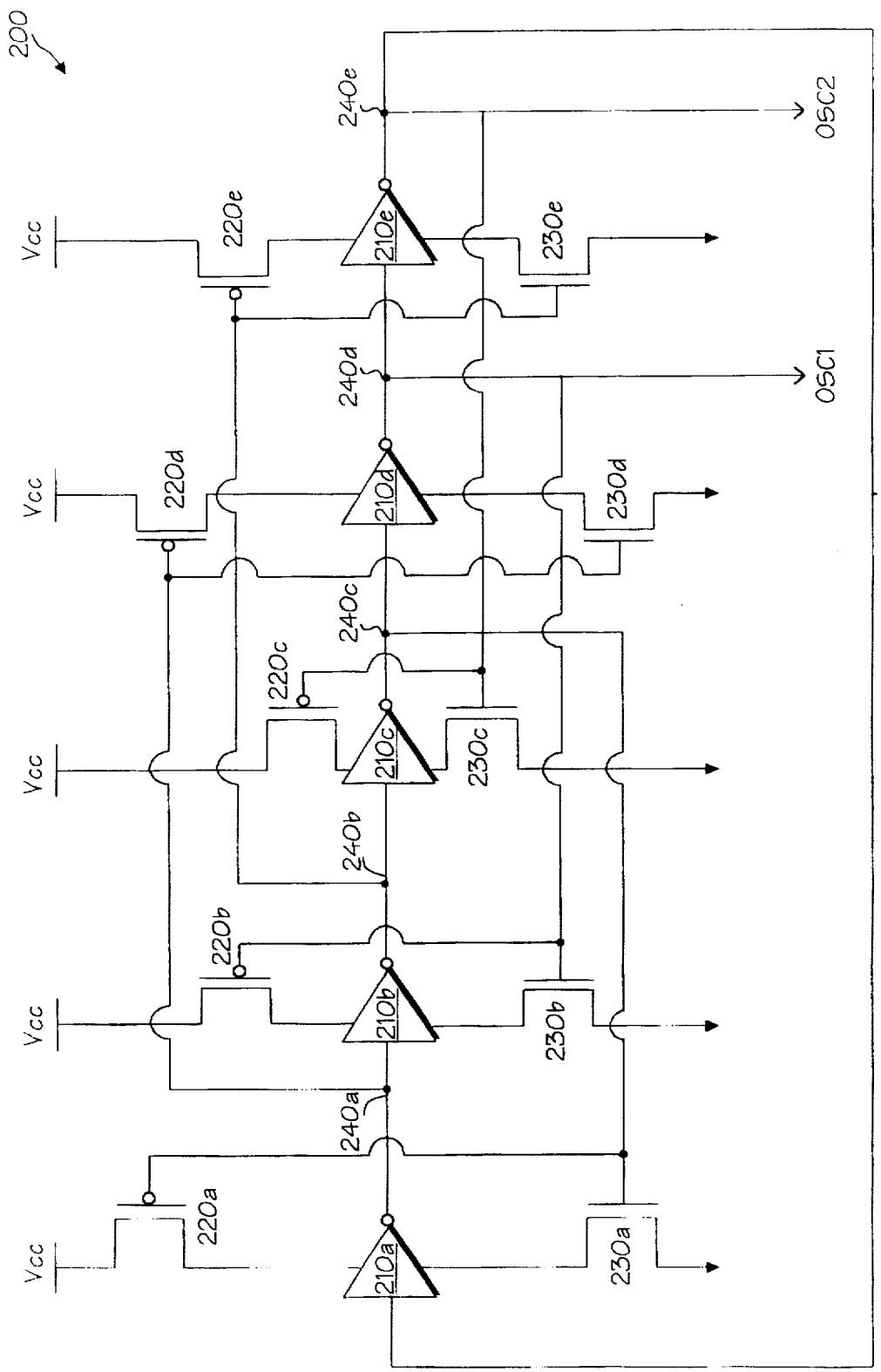
FIG. 2 illustrates one embodiment of the present ring oscillator.

FIG. 2 illustrates one embodiment of the present ring oscillator having a ring of five inverters. The unique architecture of the ring oscillator 200 substantially reduces or eliminates the crow-bar current in each of the inverters. Thus, the overall power consumption of the ring oscillator 200 is reduced. Furthermore, the present ring oscillator 200 reduces the frequency of the oscillating circuit in order to reduce or eliminate the use of parasitics or longer length transistors to slow down the ring oscillator. The ring oscillator 200 may be incorporated into various charge pumps as well as other applications.

According to FIG. 2, the ring oscillator 200 includes the inverters 210a, 210b, 210c, 210d, and 210e coupled in a ring. Each inverter is coupled to Vcc via a p-channel transistor and to ground via an n-channel transistor. The p-channel transistors 220a, 220b, 220c, 220d and 220e operate as power switches to couple or decouple their respective inverters to Vcc. On the other hand, the n-channel transistors 230a, 230b, 230c, 230d and 230e operate as power switches to couple or decouple their respective inverters to ground.

According to FIG. 2, the gate terminals of transistors 220a and 230a are coupled to node 240c such that when the voltage at 240c is a logic "low", then the transistor 220a is turned "on" and the transistor 230a is turned "off". In this scenario, the inverter 210a is coupled to Vcc and decoupled from ground. On the other hand, when the voltage at 240c is a logic "high", then the transistor 220a is turned "off" and the transistor 230a is turned "on" such that the inverter 210a is coupled to ground and not Vcc. Similarly, the gate terminals of transistors 220b and 230b are coupled to node 240d, the gate terminals of transistors 220c and 230c are coupled to node 240e, the gate terminals of transistors 220d and 230d are coupled to node 240a, and the gate of transistors 220e and 230e are coupled to node 240b. The ring oscillator 200 outputs a first oscillating voltage signal at node 240d and a second oscillating voltage signal at node 240e. For an alternative embodiment, nodes 240a, 240b, and 240c may be used to output an oscillating voltage signal.

Figure 3:
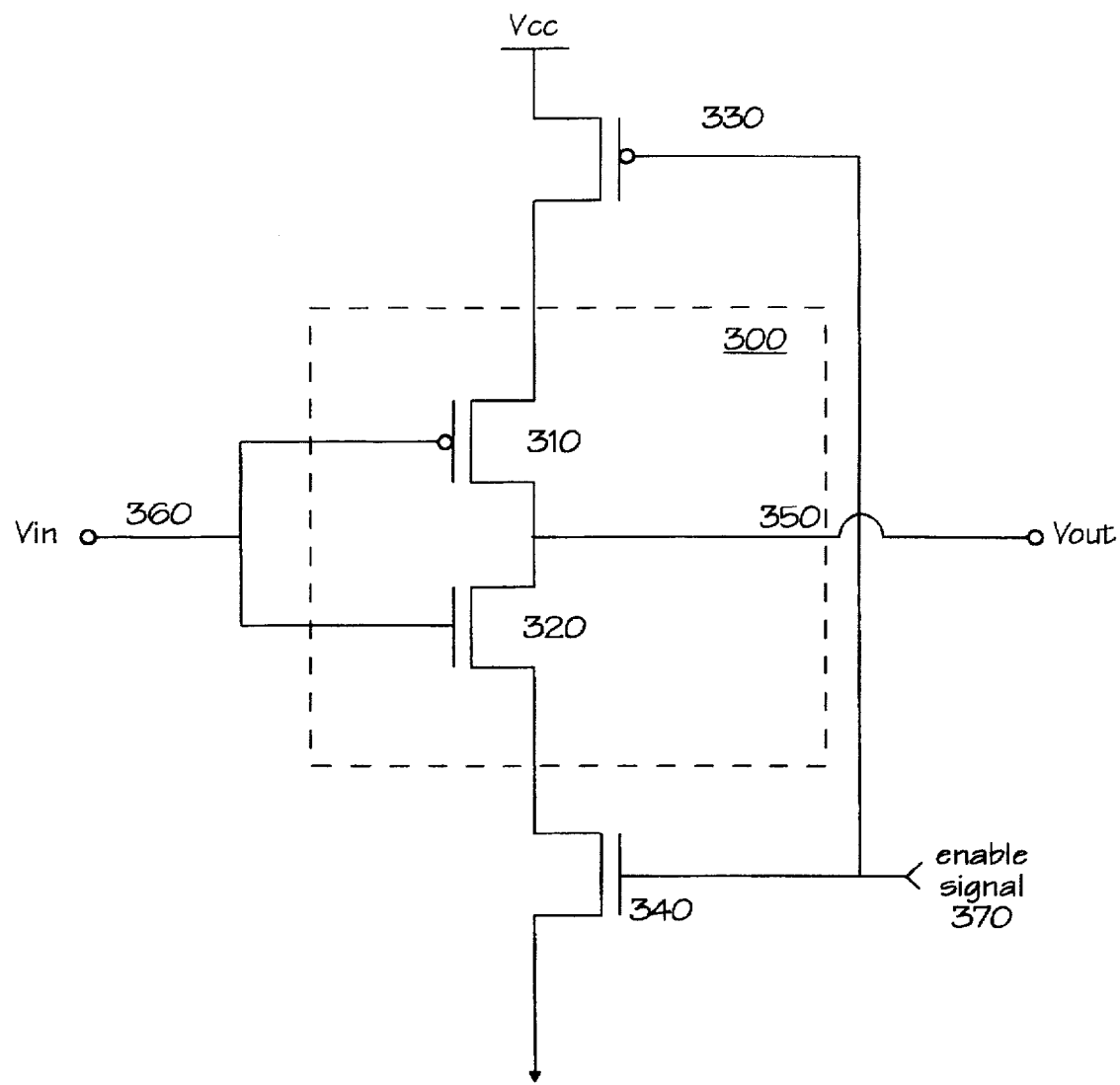
FIG. 3 illustrates an inverter in the present ring oscillator.

For one embodiment, the inverters 210a–e are implemented with a typical CMOS inverter. FIG. 3 illustrates a typical CMOS inverter 300 coupled to the p-channel transistor 330 and the n-channel transistor 340 which operates as power switches. The transistors 330 and 340 turn "on" and "off" in response to an enable signal 370. The inverter 300 includes the p-channel transistor 310 and the n-channel transistor 320. According to FIG. 3, the inverter 300 is coupled to Vcc via transistor 330 and to ground via transistor 340. When the inverter 300 receives an input signal at node 360 having a logic "low" level, the inverter 300 generates an output signal at node 350 having a logic "high" level and vice versa, provided the inverter 300 is coupled to the appropriate power source.

When a low input signal is applied to node 360, the transistor 310 turns "on" and the transistor 320 turns "off." In this scenario, when the inverter 300 is coupled to Vcc, then the inverter 300 generates a high output signal until the inverter is decoupled from Vcc. On the other hand, when a high input signal is applied to node 360, the transistor 320 turns "on" and the transistor 310 turns "off". In this scenario, when the inverter 300 is coupled to ground, then the inverter 300 generates a low output signal until the inverter is decoupled from ground.

By incorporating the power switches that couple or decouple the inverters to Vcc or ground, the ring oscillator 200 substantially reduces or eliminates the significant amount of current that is consumed by the "power supply crow-barring". The crow-bar current is also referred to as the short-circuit current between the supply voltage and ground. Typically, as the input voltage switches voltage levels (e.g. from "low" to "high" or "high" to "low"), there is a transitional period in which both the transistors 310 and 320 are conducting. During this transitional period, the inverter 300 generates current spikes between Vcc and ground which consumes unnecessary power.

A typical inverter that is not coupled to power supply switches may generate approximately 1 milliamp of crow-bar current. However, for one embodiment the present ring oscillator 200 substantially reduces the crow-bar current in each inverter to approximately 50 microamps. The ring oscillator 200 can achieve this significant reduction in power consumption by anticipating the voltage level change at the input of each inverter 210a–e.

For example, assume the voltage signal at the input of the inverter 210a is a logic "1". After a first delay period through the inverter 210a, a second delay period through the inverter 210b and a third delay period through the inverter 210c, the voltage at node 240c is at a logic "0". When this occurs, the transistor 220a is turned "on," coupling the inverter 210a to Vcc, and the transistor 230a is "off," decoupling the inverter 210a from ground. Therefore, before the input voltage signal into inverter 220a switches from a logic "1" to a logic "0", the transistors that comprise the inverter 210a are both turned "off" such that when the switch occurs, there is negligible crow-bar current. By anticipating the switch in voltage level of the input voltage signals into inverters 210a–e in this manner, the ring oscillator significantly reduces its power consumption.

The present invention also concerns an inverter circuit that substantially reduces its power consumption by eliminating the crow-bar current. The inverter circuit is referred to as an anticipating inverter circuit because it incorporates the same look-head feature that is used to substantially reduce the crow-bar current in the inverters in the ring oscillator 200. The present anticipating inverter circuit may be incorporated into any circuit having an inverter. For example, the present anticipating inverter circuit is well suited for reducing the power consumption in driver circuits.

Figure 4:
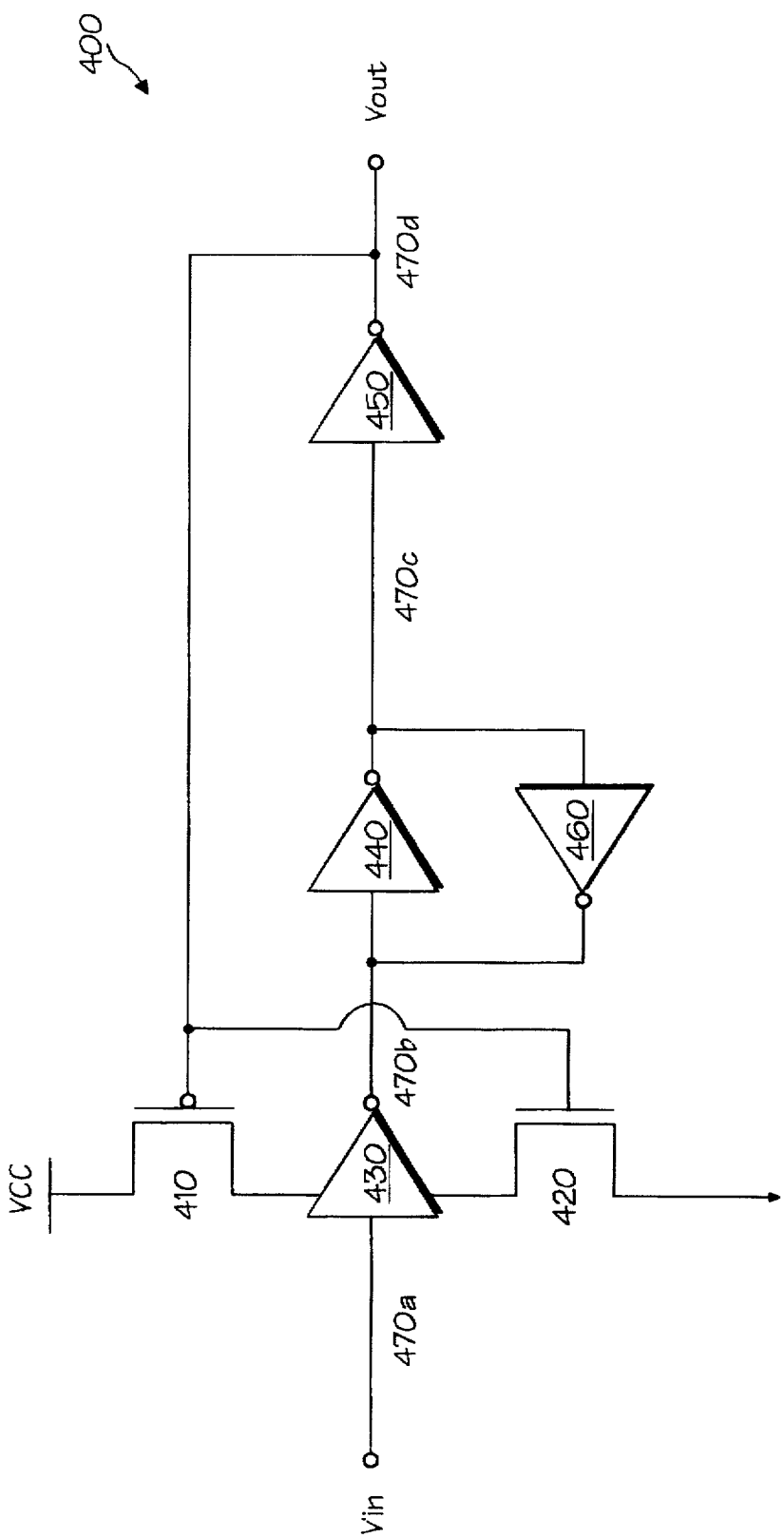
FIG. 4 illustrates one embodiment of the present inverter circuit.

FIG. 4 illustrates one embodiment of the inverter circuit in the present invention. Essentially, the inverter circuit 400 is looking ahead or anticipating that the voltage level at its input is going to switch voltage levels. The inverter circuit 400 achieves this look-ahead feature by coupling inverters 430, 440 and 450 in a serial order such that the input of the inverter circuit 400 is coupled to node 470a and the output of the inverter circuit 400 is coupled to node 470d.

The inverter 430 is coupled to Vcc via p-channel transistor 410 and ground via n-channel transistor 420. The gate of transistors 410 and 420 are coupled to the output of the inverter circuit 400 at node 470d. Therefore, the transistors 410 and 420 operate as power switches that couple or decouple the inverter 430 respectively to Vcc or ground in response to the voltage at node 470d. Therefore, at any one time, the inverter 430 is either coupled to Vcc or ground but not both at the same time.

The inverter circuit 400 also includes inverter 460 which provides a feedback loop from node 470c to node 470b. The feedback inverter 460 may stabilize the voltage at node 470b until the voltage at node 470b changes in response to the input signal into node 470a switching voltage levels.

For one embodiment, the inverters 430, 440, 450 and 460 are implemented with the CMOS inverter circuit 300 shown in FIG. 3. Assuming that node 470a is at a logic "1", then node 470b is at a logic "0" after a first delay period, node 470c is at a logic "1" after a second delay period and node 470d is at a logic "0" after a third delay period. Furthermore, after the third delay period, transistor 410 turns "on" and transistor 420 turns "off". When this occurs, inverter 430 is decoupled from ground and coupled to Vcc. As a result, both transistors in the inverter 430 are turned "off" and node 470b is left floating. Thus, the feedback transistor 460 may stabilize node 470b until the input voltage at node 470a switches voltage levels.

By decoupling the inverter 430 from ground and coupling the inverter 430 to Vcc, the inverter 430 is essentially powered-off until the voltage at the input 470a switches from a logic "1" to a logic "0". When the switch occurs, the transitionary period in which both transistors are "on" is substantially reduced or eliminated. In other words, the inverter 430 does not generate any crow-bar current or substantially reduces the crow-bar current. Therefore, by anticipating that the voltage at the input of the inverter circuit 400 is going to switch voltage levels, the crow-bar current in each inverter is substantially reduced and the overall power consumption of the inverter circuit 400 is significantly reduced.

For one embodiment, the present invention efficiently charges the output voltage signal of a charge pump by using a capacitor having a constant capacitance. For one embodiment, capacitors having a constant capacitance may be referred to as tap capacitors. A tap capacitor implemented with MOS transistors is essentially a transistor that no longer operates as a transistor because it is always turned "on". The lag period is associated with the time it takes to generate a channel between the drain and the source terminals of the transistor. Unlike a typical transistor, the tap capacitor taps (i.e. shorts) the drain and the source terminals. Therefore no significant lag time is required to generate a channel between the source and the drain terminals. As such, the tap capacitor can almost instantaneously charge a node once a voltage signal is applied to its input.

FIG. 5 illustrates a typical capacitor implemented with an n-channel MOS transistor 500. The n-channel MOS transistor is formed on a p-type silicon substrate 510. The two heavily doped n+ wells 520a and 520b are coupled to the source terminal at 530a and the drain terminal at 530b, respectively. Furthermore, the gate 550 is deposited on the oxide layer 540. According to FIG. 5, the source terminal 530a and the drain terminal 530b are coupled together at Vout and the gate terminal 530c is coupled to Vin. The MOS transistor 500 is capable of operating as a capacitor once the difference between Vin and Vout approaches the threshold voltage Vt of MOS transistor 500. In other words, the MOS transistor 500 does not effectively pass charge until the gate terminal is greater than the source/drain terminal by at least the threshold voltage. Note that the source terminal 530a is coupled to the drain terminal 530b. A capacitor that passes charge immediately upon receiving an input voltage signal at Vin is commonly referred to as a "tap" capacitor.

FIG. 6 illustrates one embodiment of a tap capacitor that may be used to replace capacitors 120a and 120b in the charge pump 100. The present tap capacitor may be used in other embodiments of the charge pump, as well as in other applications in which a tap capacitor is useful.

According to FIG. 6, the n-region 610a is coupled to the source terminal 640a and the n-region 610b is coupled to the drain terminal 640b. The source terminal 640a and the drain terminal 640b are coupled together forming Vout. The n-regions 610a and 610b are surrounded by an n+ diffusion region which is further surrounded by an n-well region. The n+ region 620 forms a tap that creates a channel between the n-regions 610a and 610b. In other words, the MOS transistor 600 is permanently turned "on" such that the "dead" voltage is substantially reduced or eliminated when a voltage signal is applied to Vin. Therefore, the present tap capacitor may improve the efficiency of a charge pump by charging up faster than the typical capacitor.

The invention has been described above with reference to specific exemplary embodiments. It is evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. An apparatus for charging up a voltage signal comprising:
    (a) at least one diode configured to receive a first voltage signal;
    (b) at least one capacitor having a constant capacitance and configured to couple charge onto said at least one diode; and
    (c) an oscillating circuit coupled to at least one of said capacitors, said oscillating circuit configured to provide at least one of said capacitors with an oscillating signal that alternates between a first voltage level and a second voltage level at a predetermined frequency, wherein said oscillating circuit comprises N inverters coupled in a ring, wherein N is an odd number of three or more, each of said N inverters has an input and an output, an output of a first inverter is coupled to an input of a second inverter, and so forth until an output of an (N−1)th inverter is coupled to an input of an Nth inverter and an output of said Nth inverter is coupled to an input of said first inverter, each of said N inverters is capable of anticipating a voltage level switch on its input, and wherein each of said N inverters is coupled to a first voltage conduit via a first power switch and coupled to a second voltage conduit via a second power switch such that each of said N inverters is coupled to one of said first and said second voltage conduits and decoupled from the other one of said first and said second voltage conduits in response to a control signal received by said first and said second power switches, each of said N inverters is capable of being powered "off" before an input signal of each of said N inverters switches voltage levels.

2. The apparatus of claim 1, wherein at least one of said capacitors is a tap capacitor.

3. The apparatus of claim 2, wherein said at least one diode includes a first diode and wherein said apparatus further comprises an input device having a first input, a second input, and an output, said first input is coupled to a first voltage conduit and receives the first voltage signal, said second input receives an enable signal, and said output is coupled to said first diode, said input device is capable of coupling or decoupling said first voltage signal to said first diode in response to said enable signal.

4. The apparatus of claim 1, wherein said oscillating circuit comprises five inverter circuits, wherein an input of said first and said second power switches of said first inverter are coupled to an output of a third inverter, an input of said first and said second power switches of said second inverter are coupled to an output of a fourth inverter, an input of said first and said second power switches of said third inverter are coupled to an output of a fifth inverter, an input of said first and said second power switches of said fourth inverter are coupled to an output of said first inverter, and an input of said first and said second input of said power switches of said fifth inverter are coupled to an output of said second inverter.

5. The apparatus of claim 1, wherein each of said inverters comprises an n-channel transistor coupled to a p-channel transistor, an input of said p-channel transistor and said n-channel transistor are coupled to an input of said inverter and an output of said p-channel transistor and said n-channel transistor are coupled to an output of said inverter, said p-channel transistor is coupled to said first voltage conduit via said first power switch and said n-channel transistor is coupled to said second voltage conduit via said second power switch.

6. An apparatus for charging up a voltage signal comprising:
    a first diode having an input and an output;
    a second diode having an input and an output;
    a first tap capacitor having a constant capacitance and configured to couple charge onto said first diode;
    a second tap capacitor having a constant capacitance and configured to couple charge onto said second diode;
    an oscillating circuit coupled to at least one of said first and second tap capacitors, said oscillating circuit configured to provide at least one of said first and second tap capacitors with an oscillating signal that alternates between a first voltage level and a second voltage level at a predetermined frequency; and
    an input device having a first input, a second input, and an output, said first input is coupled to a first voltage conduit and receives a first voltage signal, said second input receives an enable signal, said input device capable of coupling or decoupling a first voltage signal to said input of said first diode in response to said enable signal, wherein said input of said first diode is coupled to a first node which is coupled to said output of said input device and to said first tap capacitor, said output of said first diode is coupled to a second node which is coupled to said second tap capacitor and said input of said second diode, said output of said second diode is coupled to a third node, wherein said second diode outputs a second voltage signal configured to charge said third node to a voltage level greater than the voltage level of said first voltage signal.

7. The apparatus of claim 6, wherein said first tap capacitor is capable of coupling charge onto said first node in response to said first voltage signal received by said first diode and a first oscillating signal received by said first tap capacitor, said second tap capacitor is capable of coupling charge onto said second node in response to a third voltage signal provided by said first diode and a second oscillating signal received by said second tap capacitor.

8. The apparatus of claim 6, wherein at least one of said first or second diodes includes a transistor having a first and second terminal coupled to an input of said transistor and a third terminal coupled to an output of said transistor.

9. The apparatus of claim 6, wherein said first tap capacitor has a first terminal coupled to said first node and a second and third terminal coupled to a first output of said oscillating circuit, and wherein said second tap capacitor has a first terminal coupled to said second node and a second and third terminal coupled to a second output of said oscillating circuit.

10. The apparatus of claim 6, wherein said oscillating circuit comprises N inverters coupled in a ring, wherein N is an odd number of three or more, each of said N inverters has an input and an output, an output of a first inverter is coupled to an input of a second inverter, and so forth until an output of an (N−1)th inverter is coupled to an input of an Nth inverter and an output of said Nth inverter is coupled to an input of said first inverter, each of said N inverters is capable of anticipating a voltage level switch on its input.

11. An apparatus for charging up a voltage signal comprising:

(a) at least one diode configured to receive a first voltage signal;

(b) at least one tap capacitor having a constant capacitance and configured to couple charge onto said at least one diode; and (c) an oscillating circuit coupled to at least one of said capacitors, said oscillating circuit configured to provide said at least one tap capacitor with an oscillating signal that alternates between a first voltage level and a second voltage level at a predetermined frequency, wherein said at least one tap capacitor has a source formed in a first N-region and a drain formed in a second N-region, wherein an N+ tap region surrounding said first N-region and said second N-region is implemented by one of diffusion and implantation into an N-well formed on a P-substrate, said N+ tap region forms a channel between said first N-region and said second N-region such that said at least one tap capacitor is always "on", said at least one tap capacitor further has a gate formed by poly-silicon above said N+ tap region between said first N-region and said second N-region.

12. An apparatus for charging up a voltage signal comprising:

(a) at least one diode configured to receive a first voltage signal;

(b) at least one capacitive device configured to couple charge onto said at least one diode; and (c) an oscillating circuit coupled to said at least one capacitive device, said oscillating circuit configured to provide said at least one capacitive device with an oscillating signal that alternates between a first voltage level and a second voltage level at a predetermined frequency, said oscillating circuit comprises an odd number of inverters, wherein each of said inverters is coupled to a first voltage conduit via a first power switch and coupled to a second voltage conduit via a second power switch such that each of said inverters is coupled to one of said first and said second voltage conduits and decoupled from the other one of said first and said second voltage conduits in response to a control signal received by said first and said second power switches, each of said inverters is capable of being powered "off" before an input signal of each of said inverters switches voltage levels.

13. The apparatus of claim 12, wherein said odd number of inverters is coupled in a ring wherein an output of a first inverter is coupled to an input of a second inverter and so forth until an output of an (N−1)th inverter is coupled to an input of an Nth inverter and an output of an Nth inverter is coupled to an input of said first inverter.

14. The apparatus of claim 12, wherein said at least one diode includes a first diode and wherein said apparatus further comprises an input device having a first input, a second input, and an output, said first input is coupled to a first voltage conduit and receives the first voltage signal, said second input receives an enable signal, and said output is coupled to said first diode, said input device is capable of coupling or decoupling said first voltage signal to said first diode in response to said enable signal.

15. The apparatus of claim 12, wherein said oscillating circuit comprises five inverter circuits, wherein an input of said first and said second power switches of said first inverter are coupled to an output of a third inverter, an input of said first and said second power switches of said second inverter are coupled to an output of a fourth inverter, an input of said first and said second power switches of said third inverter are coupled to an output of a fifth inverter, an input of said first and said second power switches of said fourth inverter are coupled to an output of said first inverter, and an input of said first and said second input of said power switches of said fifth inverter are coupled to an output of said second inverter.

16. The apparatus of claim 12, wherein each of said inverters comprises an n-channel transistor coupled to a p-channel transistor, an input of said p-channel transistor and an input of said n-channel transistor are coupled to an input of said inverter, and an output of said p-channel transistor and an output of said n-channel transistor are coupled to an output of said inverter, said p-channel transistor is coupled to said first voltage conduit via said first power switch and said n-channel transistor is coupled to said second voltage conduit via said second power switch.

17. The apparatus of claim 12, wherein at least one of said capacitive devices is a tap capacitor.

18. The apparatus of claim 14, wherein said at least one diode further includes a second diode, and wherein at least one of said capacitive devices includes a first tap capacitor and a second tap capacitor, an input of said first diode is coupled to a first node which is coupled to said output of said input device and to said first tap capacitor, an output of said first diode is coupled to a second node which is coupled to said second tap capacitor and an input of said second diode, an output of said second diode is coupled to a third node, wherein said second diode outputs a second voltage signal configured to charge said third node to a voltage level greater than the voltage level of said first voltage signal.

19. An apparatus for charging up a voltage signal comprising:

a first diode having an input and an output;

a second diode having an input and an output;

a first capacitive device configured to couple charge onto said first diode;

a second capacitive device configured to couple charge onto said second diode;

an oscillating circuit coupled to at least one of said first and second capacitive devices, said oscillating circuit configured to provide at least one of said first and second capacitive devices with an oscillating signal that alternates between a first voltage level and a second voltage level at a predetermined frequency, said oscillating circuit comprising an odd number of inverters each of which is independently capable of being powered "off" before receiving a second input signal having a voltage level that is opposite from a first input signal; and an input device having a first input, a second input, and an output, said first input is coupled to a first voltage conduit and receives a first voltage signal, said second input receives an enable signal, said input device capable of coupling or decoupling a first voltage signal to said input of said first diode in response to said enable signal, wherein said input of said first diode is coupled to a first node which is coupled to said output of said input device and to said first capacitive device, said output of said first diode is coupled to a second node which is coupled to said second capacitive device and said input of said second diode, said output of said second diode is coupled to a third node, wherein said second diode outputs a second voltage signal configured to charge said third node to a voltage level greater than the voltage level of said first voltage signal.

20. The apparatus of claim 19, wherein said first capacitive device is capable of coupling charge onto said first node in response to said first voltage signal received by said first diode and a first oscillating signal received by said first capacitive device, said second capacitive device is capable of coupling charge onto said third node in response to a second voltage signal provided by said first diode and a second oscillating signal received by said second capacitive device.

21. The apparatus of claim 19, wherein at least one of said first or second diodes includes a transistor having a first and second terminal coupled to an input of said transistor and a third terminal coupled to an output of said transistor.

* * * * *